(12) United States Patent
Bisges

(10) Patent No.: US 9,182,148 B2
(45) Date of Patent: Nov. 10, 2015

(54) THERMAL SOLAR SYSTEM

(75) Inventor: Michael Bisges, Sinzing (DE)

(73) Assignee: O-FLEXX TECHNOLOGIES GMBH, Duisburg (DE)

( * ) Notice: Subject to any disclaimer, the term of this patent is extended or adjusted under 35 U.S.C. 154(b) by 1040 days.

(21) Appl. No.: 12/919,656

(22) PCT Filed: Feb. 4, 2009

(86) PCT No.: PCT/EP2009/051222
§ 371 (c)(1),
(2), (4) Date: Aug. 26, 2010

(87) PCT Pub. No.: WO2009/109440
PCT Pub. Date: Sep. 11, 2009

(65) Prior Publication Data
US 2011/0005563 A1   Jan. 13, 2011

(30) Foreign Application Priority Data

Feb. 29, 2008  (DE) .......................... 10 2008 011 983

(51) Int. Cl.
| H01L 35/00 | (2006.01) |
| --- | --- |
| F24J 2/46 | (2006.01) |
| H01L 35/30 | (2006.01) |
| F24D 11/00 | (2006.01) |
| F24D 17/00 | (2006.01) |

(Continued)

(52) U.S. Cl.
CPC ............ *F24J 2/4621* (2013.01); *F24D 11/003* (2013.01); *F24D 17/0021* (2013.01); *F24J 2/0483* (2013.01); *F24J 2/24* (2013.01); *F24J 2/40* (2013.01); *H01L 35/30* (2013.01); *F24H 2240/00* (2013.01); *F24J 2002/0092* (2013.01); *Y02B 10/20* (2013.01); *Y02E 10/44* (2013.01)

(58) Field of Classification Search
CPC ............................ H01L 35/30; F24D 17/0015
USPC ................................... 136/200–242
See application file for complete search history.

(56) References Cited

U.S. PATENT DOCUMENTS 4,114,600 A * 9/1978 Newton .......................... 126/588
4,292,579 A * 9/1981 Constant ....................... 322/2 R (Continued)

FOREIGN PATENT DOCUMENTS

| DE | 35 14 490 | 10/1986 |
| --- | --- | --- |
| DE | 37 04 559 | 8/1988 |

(Continued)

OTHER PUBLICATIONS

English Translation of International Preliminary Examination Report dated Oct. 7, 2010 issued in corresponding application No. PCT/EP2009/05122.

*Primary Examiner* — Jeffrey T Barton
*Assistant Examiner* — Niki Bakhtiari
(74) *Attorney, Agent, or Firm* — Lucas & Mercanti, LLP

(57) ABSTRACT

A thermal solar system including a collector that is connected to a heat sink, in particular a heat storage medium, by way of a solar circuit containing a heat exchange medium. To reduce overheating of the system during idling and to improve the efficiency of the solar system, the solar circuit is connected temporarily to at least one heat exchanger by way of a valve control unit disposed at a hot side of a thermogenerator receiving an inflowing heat flow. A thermal insulation reduces the exchange of thermal energy between the collector of a thermal solar system and the heat exchanger.

17 Claims, 2 Drawing Sheets

(51) Int. Cl.
*F24J 2/04* (2006.01)
*F24J 2/24* (2006.01)
*F24J 2/40* (2006.01)
*F24J 2/00* (2014.01)

(56) References Cited

U.S. PATENT DOCUMENTS

| | | | | |
|---|---|---|---|---|
| 4,402,188 | A | * | 9/1983 | Skala ................................ 62/56 |
| 4,969,956 | A | * | 11/1990 | Kreider et al. ................ 136/201 |
| 6,857,425 | B2 | | 2/2005 | Flick |
| 2003/0196652 | A1 | | 10/2003 | Flick |

FOREIGN PATENT DOCUMENTS

| | | | |
|---|---|---|---|
| DE | 101 22 679 | | 12/2002 |
| DE | 195 37 121 | | 10/2003 |
| DE | 20 2005 002198 | | 4/2005 |
| DE | 10 2006 023616 | | 11/2007 |
| GB | 2172394 | * | 1/1986 |
| GB | 2 172 394 | | 9/1986 |
| JP | S6011062 A | | 1/1985 |
| JP | 2002106964 A | | 4/2002 |
| WO | WO 80/01438 | | 7/1980 |

* cited by examiner

THERMAL SOLAR SYSTEM

PRIORITY CLAIM

This is a U.S. national stage of Application No. PCT/EP2009/051222, filed on Feb. 4, 2009, which claims priority to German Application No: 10 2008 011 983.0, filed: Feb. 29, 2008, the contents of which are incorporated herein by reference.

BACKGROUND OF THE INVENTION

1. Field of the Invention

The invention pertains to a solar thermal power system with a collector connected to a heat sink by a solar circuit containing a heat-transfer medium.

2. Related Art

Solar power systems are called solar thermal power systems when they make use of the heat of solar radiation (solar thermal energy). The heat is made usable in architectural applications or in solar thermal power plants to generate electricity. The direct conversion of sunlight into electricity is referred to as photovoltaics, and the corresponding systems are called photovoltaic systems.

To recover heat, an absorber of a thermal collector is heated by energy of the sun. A heat-transfer medium, which absorbs the heat, flows through the collector. A pump conveys the heat-transfer medium around a solar circuit, along the course of which the heat is carried from the collector to a heat sink, especially a solar heat reservoir; the solar heat reservoir accepts the heat and stores it.

The collector is the part of the solar power system that absorbs the heat of the sun and transfers the absorbed heat to the heat-transfer medium in the solar circuit with the least possible loss.

The main difference between collectors with respect to their structural design is their configuration as either flat collectors and tubular collectors. Flat and tubular collectors differ with respect to the insulation of the absorber. The insulating effect of vacuum tube collectors is achieved by a vacuum in a glass tube, which completely suppresses the transport of heat by convection.

Flat collectors use conventional insulating materials such as mineral wool or polyurethane foam. This insulation is less efficient than a vacuum, and therefore larger collector surface areas are required to achieve comparable performance values. Today's high-power flat collectors work with a copper absorber. Because flat collectors are considerably less expensive, however, and therefore are usually more economical than vacuum-tube collectors, this type of design is used almost exclusively in the residential area.

Solar heat reservoirs differ from conventional process water tanks primarily with respect to their very heavy insulation; the tall, slender shape of the water tank allows for the formation of layers of different temperature (hot water at the top, cool water at the bottom) and a heat-transfer device is installed at a low point for transferring the heat received from the solar circuit.

When a temperature in the collector rises above a temperature at the solar heat exchanger by a predetermined temperature difference, the pump is started by a control unit, and the heat is transported to the solar heat reservoir. When the temperature difference between collector and reservoir falls below the limit value, the system is stopped.

Standard commercial collectors can convert 60-70% of the solar energy arriving at the collector surface to usable heat. In these collectors, a mixture of water and polypropylene glycol, typically in a ratio of 60:40, is used as the heat-transfer medium. Through the addition of 40% propylene glycol, frost protection down to −23° C. is achieved; below that temperature, freezing will occur but without frost shattering. In addition, a boiling temperature which can be 150° C. or more, depending on the pressure, is achieved. At higher temperatures, many collectors shut down and no longer deliver energy.

Outside the heating season, solar thermal power systems are often used only to heat water. This results in a lower total efficiency of the system. When the system is idle, there is the danger of overheating and thus of damage to the solar thermal power system.

SUMMARY OF THE INVENTION

The invention is based on creating a solar thermal power system in which the danger of overheating is reduced and the efficiency of the solar power system is improved, especially outside the heating season.

A solar thermal power system is connected to a thermoelectric generator such that the unused heat of the collector can be used to generate energy in a thermogenerator, especially when the collector is idle.

The solar circuit can be connected for certain periods of time by a valve control system to at least one heat exchanger, which is positioned on the hot side of a thermogenerator, i.e., the side which accepts the incoming heat flow, and in that thermal insulation reduces the exchange of thermal energy between the collector of the solar thermal power system and the heat exchanger.

To keep the excess heat away from the solar circuit, the circuit can be connected to the heat exchanger, which is positioned on the hot side of the thermogenerator, for certain periods of time, especially during the idle phase of the thermal solar energy system, by the valve control system. The thermal insulation between the collector and the heat exchanger almost completely prevents the removal of heat from the collector and the transfer of that heat to the thermogenerator during the working phase, that is, when the maximum heat flow is to be transferred to the heat sink, especially to the heat reservoir.

"Thermal insulation" refers to measures for suppressing the transfer of thermal energy from the collector of the solar thermal power system to the heat exchanger assigned to the thermogenerator.

According to the invention, the term "collector" comprises an arrangement consisting of one or more solar collectors (e.g., flat collectors and tubular collectors), which can be connected to each other in series and/or in parallel.

A collector of this type is connected to the heat sink by the solar circuit. Suitable heat sinks include heat reservoirs, so that the heat taken up by the collectors can be used independently of the actual solar radiation. It is also conceivable, however, that the heat taken up by the collectors could be supplied directly via the solar circuit to a consumer acting as a heat sink.

If a plate-shaped heat exchanger with the thermogenerator is positioned so that it lies substantially flat against the passive flat rear surface of the collector, a thermally insulating intermediate layer of insulating material, especially plastic foam or mineral wool, is provided as thermal insulation between the collector and the heat exchanger.

Insofar as space allows, the plate-shaped heat exchanger with the thermogenerator can be designed as a component separate from the collector. In this case, the distance between the collector and the plate-shaped heat exchanger ensures that, during the working phase of the collector, almost no heat will be transferred by convection to the heat exchanger, and as a result overall efficiency of the solar thermal power system increases. The design as a separate component also offers the advantage that an absorber for accepting the energy of the incoming solar radiation can be positioned on the hot side of the thermogenerator to introduce additional energy into the solar power system. This additional energy can be used to generate electrical power, or a portion of it can be used in the solar circuit to heat the heat reservoir.

For the last-mentioned hybrid operating mode, the valve control system comprises proportional valves, which allow the volume flow rate of the heat-transfer medium in the solar circuit and in the heat exchanger to be adjusted.

In a simpler embodiment of the solar thermal power system, the collector can, if desired, be connected to the heat reservoir or to the heat exchanger of the thermogenerator by at least one multi-port valve.

If at least one 3-way or 2-way valve is installed in the forward flow line and at least one also in the return flow line, the heat exchanger of the thermogenerator can be completely disconnected from the solar circuit.

To prevent overheating and thus damage to the thermal solar power system, the flow route from the collector to the thermogenerator is opened, especially during the idle state, that is, the state in which the heat reservoir is completely heated. In the idle state, all of the heat is conducted from the collector to the heat exchanger and partially converted in the thermogenerator to electric power. While the heat reservoir is being heated preferably no thermal energy is sent to the thermogenerator.

The one or more valves of the valve control system can be actuated by hand. Preferably the valves are electrically actuated multi-port valves or proportional valves, which are actuated by the control unit of the solar power system which is already installed in any case, and which, on the basis of its measurement sensors, recognizes the idle state of the solar power system and as a result sends the appropriate switching command to each valve. For the more complex hybrid operating mode, the control unit distributes the heat-transfer medium as a function of demand via at least one proportional valve between the heat reservoir and the thermogenerator under consideration of the heat outflow from the heat exchanger and the intensity and duration of the solar radiation at the collector.

A thermocouple operated as a thermogenerator produces electrical voltage on the basis of the Seebeck effect. In most cases, a relatively large number of pairs of thermoelectric elements are connected together to form a thermocouple. The thermogenerator can comprise one or more thermocouples, which are connected electrically in series and/or in parallel. The thermoelectric voltage generated by the thermocouples is temperature-dependent and is typically in the range of a few microvolts. A few alloys have become widely accepted as thermoelectric pairs because of their properties at certain temperatures. A spectrum of thermoelectric material combinations (thermoelectric pairs) extending over a temperature range from −270° C. to 2600° C. has been developed. This spectrum is covered and defined by standards. The currently valid international standard for thermocouples is IEC 584-1, the counterpart to which in German-speaking countries is DIN EN 60584, Part 1. This standard defines 10 different thermoelectric material combination in terms of their properties:

| Type/Code Letter | Alloy |
| --- | --- |
| K | nickel-chromium/nickel-aluminum |
| T | copper/copper-nickel |
| J | iron/copper-nickel |
| N | nickel-chromium-silicon/nickel-silicon |
| E | nickel-chromium/copper-nickel |
| R | platinum-13% rhodium/platinum |
| S | platinum-10% rhodium/platinum |
| B | platinum-30% rhodium/platinum |

Another standard also used in Germany is DIN 43710, which defines thermoelectric types U and L. This standard is no longer valid, however.

| | |
| --- | --- |
| U | copper/copper-nickel |
| L | iron/copper-nickel |

In addition to the standardized thermoelectric pairs, there are also other combinations with special properties. Examples include the tungsten/tungsten-rhenium combination with possible temperature ranges up to 2600° C.

As conductive materials for the thermoelectric pairs of thermocouples, p-doped and n-doped semiconductor materials, usually bismuth-tellurite, $Bi_2Te_3$ in particular, can also be considered. In addition, the p-doped and n-doped compounds listed in the following Tables 1.1 and 1.2 can be used:

TABLE 1.1.

The p-type compounds with the best thermoelectric properties.

| T (K) | Compound, p-type | Z (1/K) |
| --- | --- | --- |
| 225 | $CsBi_4Te_6:Sb_3(0.05\%)$ | $3.5 - 10^{-3}$ |
| 300 | $(Sb_2Te_3)_{72}(Bi_2Te_3)_{25}(S_2Se_3)_3$ | $3.4 - 10^{-3}$ |
| 500 | $Tl_9BiTe_6$ | $2.3 - 10^{-3}$ |
| 700 | $GeTe_{1-x}(AgSbTe_2)_x$ | $3.0 - 10^{-3}$ |
| 1200 | $Si_{0.85}Ge_{0.15}:B$ | $6.7 - 10^{-4}$ |

TABLE 1.2.

The n-type compounds with the best thermoelectric properties.

| T (K) | Compound, n-type | Z (1/K) |
| --- | --- | --- |
| 80 | $Bi_{0.85}Sb_{0.15}$ | $6.5 - 10^{-3}$ |
| 300 | $((Sb_2Te_3)_5Bi_2Te_3)_{90}(Sb_2Se_3)_5$ | $3.2 - 10^{-3}$ |
| 450 | $Bi_2Te_{2.7}Se_{0.3}$ | $2.8 - 10^{-3}$ |
| 800 | $Pb_{0.75}Sn_{0.25}Se$ | $>1.25 - 10^{-3}$ |
| 1200 | $Si_{0.85}Ge_{0.15}:P$ | $8.3 - 10^{-4}$ |

A thermocouple operated as a thermogenerator normally consists of two thin heat-conducting plates, especially ceramic plates, between which alternating small squares of different conductive material, especially semiconductor material, are brazed in place. In each case, two different squares are connected to each other in such a way that they produce a series circuit. One of the two plates accepts the incoming heat flow (in the following also called the "hot side" of the thermocouple), whereas the other plate releases the outgoing heat flow (in the following also called the "cold side" of the thermocouple).

In addition to conventional thermocouples arranged between plates, it is also possible to use thin-film thermocouples, such as those known by way of example from DE 101 22 679 A1.

To increase surface area available for releasing the heat of the thermogenerator on its cold side, the thermogenerator can comprise a cooling element, especially a structure with cooling fins. The fins of the finned structure are preferably perpendicular to the cold side. The improved heat dissipation obtained by use of the fins increases the efficiency of the thermogenerator.

When an entire surface of the hot side of each thermogenerator accepting the incoming heat flow rests directly on the heat exchanger, the efficiency is improved even more. The improvement results essentially from the larger overall surface area available for the transfer of heat to the hot side of the thermogenerator.

BRIEF DESCRIPTION OF DRAWINGS

The invention is explained in greater detail below on the basis of exemplary embodiments.

DETAILED DESCRIPTION OF THE DRAWINGS

Figure 1:
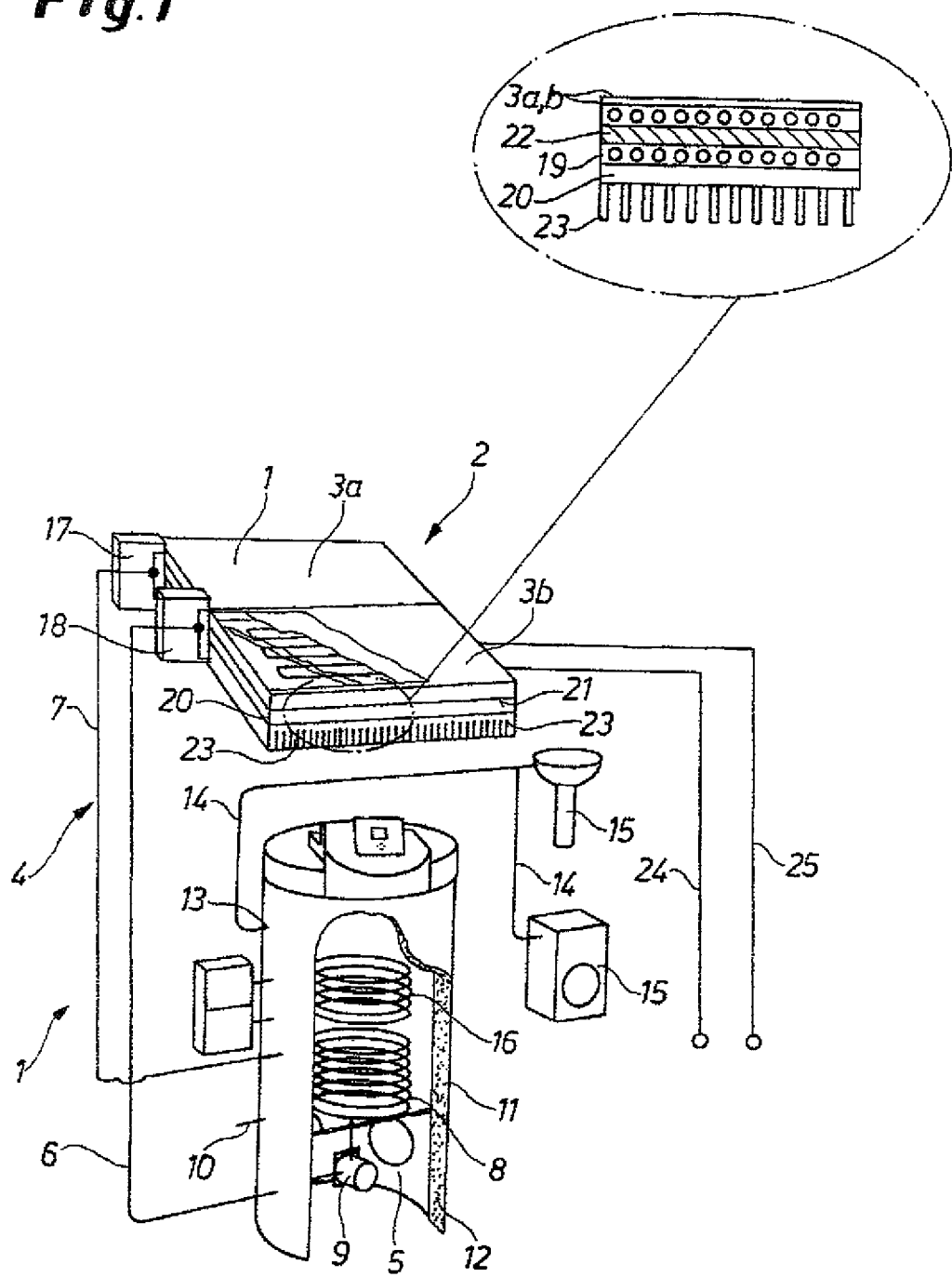
FIG. 1 is a schematic illustration of a first exemplary embodiment of a solar thermal power system with a thermogenerator of integrated design.

FIG. 1 shows a solar thermal power system, designated overall by the number 1, with a collector 2, which consists of two flat-bed collectors 3a, 3b, which are connected in series. The collector 2 is connected to a heat reservoir 5 by a solar circuit 4. The solar circuit 4 consists of a forward flow line 7, a return flow line 6, and a tubular heat exchanger 8, installed in the heat reservoir 5. In addition, a pump 9, which circulates a heat-transfer medium through the solar circuit 4 and the collector 2, is arranged at an end of the return line 6. In the exemplary embodiment shown here, the heat reservoir 5 is designed as a hollow cylindrical solar tank. The storage medium is water, which is supplied to the heat reservoir through the feed line 10. The jacket 11 of the heat reservoir, shown in partial cross section, comprises extensive thermal insulation 12 to reduce the heat loss. The tall, slender form of the heat reservoir allows the formation of different temperature layers. Hot water is present in the upper part of the tank, and cooler water is present in the lower part. The tubular heat exchanger 8 installed in the lower part of the tank serves to transfer the heat from the solar circuit 4 to the water in the heat reservoir. The outlet point 13 in the upper part of the tank of the heat reservoir 5 is connected to hot-water consumers 15 such as sinks, washing machines, and the like, by pipelines 14. A second heat exchanger 16 is also tied into the heating circuit and installed in the heat reservoir 5.

Multi-port valves 17, 18 are located at the connections of the forward flow and return lines 6, 7 to the collector 2. In a first switch position of the two multi-port valves 17, 18, their connections open the flow route from the collector 2 to the heat reservoir 5, whereas, in a second switch position of the two multi-port valves 17, 18 their connections open the flow route from the collector 2 to the heat exchanger 19 of a thermogenerator 20, so that the heat-transfer medium flows first through the collector 2 and then through the heat exchanger 19. In this switch position of the multi-port valves 17, 18, the piping system of the collector 2 is connected in series to the heat exchanger 19. In this switch position both the collector 2 and the heat exchanger 19 are essentially integrated into the solar circuit 4 leading to the heat reservoir 5. If, however, an additional pump is installed between the collector 2 and the heat exchanger 19, the collector 2 and the heat exchanger 19 can be disconnected from the solar circuit 4

The plate-shaped heat exchanger 19 is installed on a hot side of the thermogenerator 20, i.e., the side that receives the incoming heat flow. The heat exchanger 19 is made up of flat surfaces, forming a layered structure, arranged on the passive rear side 21 of the collector 2. A heat-insulating intermediate layer 22 is provided to thermally isolate the collector 2 from the heat exchanger 19. On a cold side of the thermogenerator 20, i.e., the side opposite the heat exchanger 19, a finned cooling element 23 is provided, which increases the temperature difference between the hot and cold sides of the thermogenerator 20, which preferably comprises thin-film thermocouples, and thus increases its efficiency.

The thermogenerator 20 is connected to electrical lines 24, 25 by two terminals (not shown), through which the electrical energy is carried away from the thermoelectric generator 20.

The solar thermal power system 1 operates as follows:

When the heat reservoir 5 has become completely heated, the solar thermal power system 1 enters an idle state. In this state, the solar circuit 4 can be interrupted by the two multi-port valves 17, 18, and the heat collected by the collector 2 can be sent to the heat exchanger 19 of the thermogenerator 20. In this case, the tubular heat exchanger 8 and therefore the heat reservoir 5 are disconnected from the collector 2, and all of the heat is sent to the heat exchanger 19. In this case, the previously mentioned pump is provided.

Alternatively, when there is an excess of heat in the collector 2, the multi-port valves 17, 18 are used to connect the piping system of the collector 2 in series to the heat exchanger 19. The series circuit consisting of the collector 2 and the heat exchanger 19 is tied into the solar circuit 4 leading to the heat reservoir 5, so that excess thermal energy is available for the generation of electric power in the thermogenerator.

If all of the thermal energy accumulating in the collector 2 is later required to heat the heat reservoir 5, the solar circuit 4 is connected by the multi-port valves 17, 18 to the tubular heat exchanger 8 in the heat reservoir 5, and the heat exchanger 19 of the thermogenerator 20 is completely disconnected from the collector 2. In this operating mode, all of the thermal energy is available to heat the heat reservoir 5. The heat-insulating layer 22 almost completely prevents thermal convection between the collector 2 and the thermogenerator 20, even though the two elements are combined into a single unit to save space.

Figure 2:
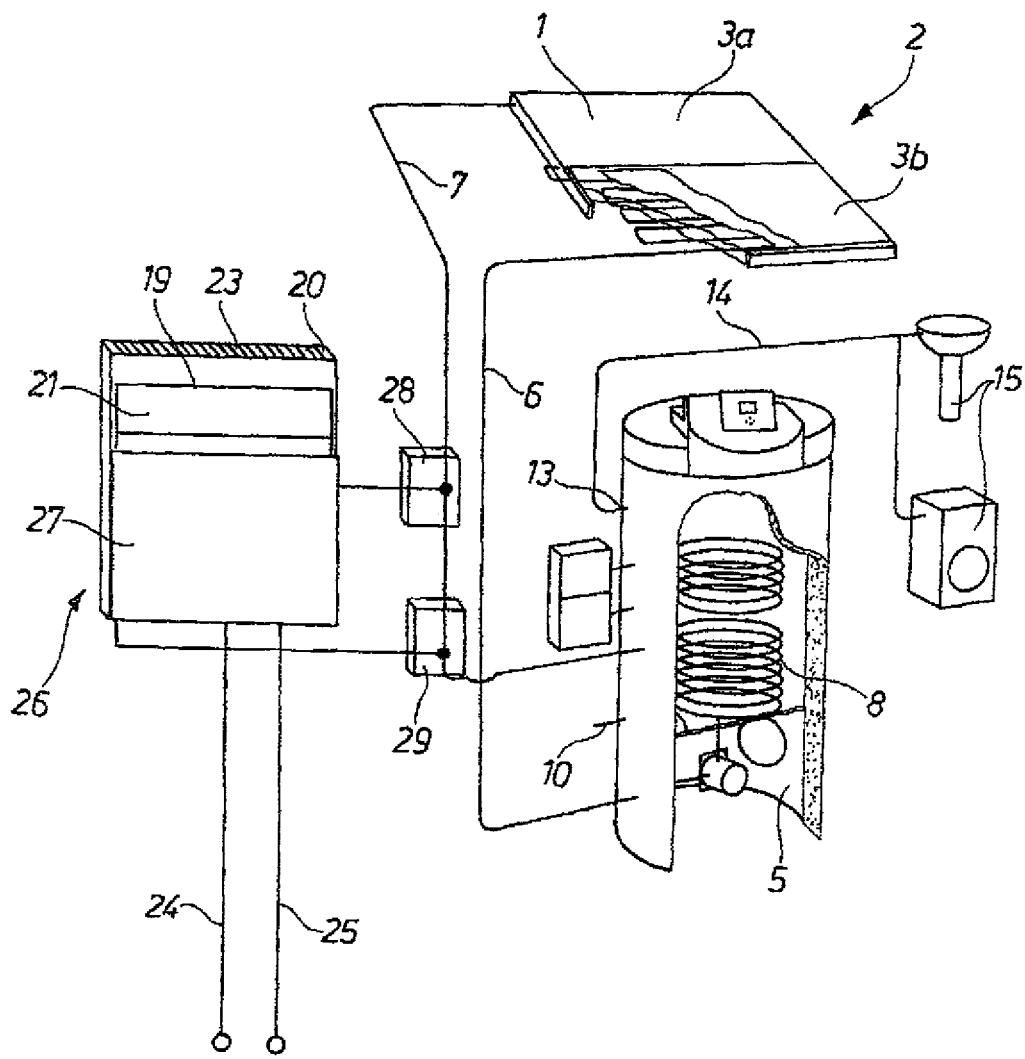
FIG. 2 is a schematic illustration of a second exemplary embodiment of a solar thermal power system with a thermogenerator designed with separate components.

The solar thermal power system according to FIG. 2 differs from FIG. 1 in that the plate-shaped heat exchanger 19 and the thermogenerator 20 are designed as a structural unit 26 separate from the collector 2. This structural unit 26 is installed a certain distance away from the collector 2, e.g., on a vertical front wall of a house, whereas the collector 2 is installed on a roof of the house. In this embodiment of the invention, the front side of the thermogenerator 20 is also equipped with an absorber plate 27, so that additional energy can be supplied to the hot side of the thermogenerator 20 or so that excess energy not required to generate thermoelectricity can be supplied to the solar circuit 4. The heat exchanger 19 can be connected in series to the collector 2 simply by the 3-way/2-way valve 28, so that the heat exchanger 19 becomes a component of the solar circuit 4. The other 3-way/2-way valve 29 is used to disconnect the heat exchanger 19 completely, when all of the thermal energy accumulated in the collector 2 is needed to heat up the heat reservoir 5. In principle, however, this valve can be omitted.

Finally, the valve control system can comprise proportional valves, which make it possible to adjust the volume flow rate of the heat-transfer medium. In a hybrid operating mode of the heat reservoir 5 and of the thermogenerator 20, the solar energy falling on the absorber plate 27 of the thermogenerator 20 and the solar energy falling on the collector 2 can, as needed, be distributed between the thermogenerator 20 and the heat reservoir 5.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A solar thermal power system comprising:
   a heat sink;
   a thermogenerator having a hot side;
   a solar circuit containing a heat-transfer medium;
   at least one heat exchanger arranged on the hot side of the thermogenerator;
   a collector connected to the heat sink by the solar circuit, the heat sink configured to receive thermal energy from the collector via the heat-transfer medium in the solar circuit;
   a valve control system configured to selectively connect for a period of time the solar circuit to the at least one heat exchanger arranged on the hot side of the thermogenerator, so that the hot side of the thermogenerator receives an incoming heat flow from the at least one heat exchanger for the period of time, whereby heat from the collector is selectively transferred to the heat sink or the at least one heat exchanger; and
   thermal insulation arranged between the collector and the at least one heat exchanger configured to reduce an exchange of thermal energy between the collector and the at least one heat exchanger, wherein the thermal insulation is affixed to a side of the collector.

2. The solar thermal power system according to claim 1, wherein the thermogenerator comprises at least one thin-film thermocouple.

3. The solar thermal power system according to claim 1, wherein the thermal insulation is a heat-insulating intermediate layer arranged between the collector and the at least one heat exchanger, wherein the at least one heat exchanger is plate-shaped with at least one flat surface, the one thermogenerator has at least one flat surface, and the thermogenerator and the at least one heat exchanger are arranged with their respective flat surfaces facing a passive rear side of the collector.

4. The solar thermal power system according to claim 1, wherein the at least one heat exchanger and the thermogenerator are designed as a structural unit separate from the collector.

5. The solar thermal power system according to claim 4, wherein the structural unit is located a certain distance away from the collector.

6. The solar thermal power system according to claim 1, wherein the at least one heat exchanger is one of a plate-type heat exchanger and a tubular heat exchanger.

7. The solar thermal power system according to claim 1, further comprising a cooling element arranged on a cold side of the thermogenerator.

8. The solar thermal power system according to claim 5, further comprising an absorber arranged on the hot side of the thermogenerator configured to receive energy of incident solar radiation.

9. The solar thermal power system according to claim 1, wherein the valve control system comprises at least one multi-port valve.

10. The solar thermal power system according to claim 9, wherein, in at least one switch position of the at least one multi-port valve, the collector is connected to the at least one heat exchanger for the certain period of time.

11. The solar thermal power system according to claim 1, wherein the solar circuit further comprises: a forward flow line between the collector and the heat sink; and a return line between the collector and the heat sink; and the solar thermal power system further comprising: at least one proportional valve arranged in the forward flow line configured to adjust a volume flow rate of the heat-transfer medium from the collector to the solar circuit and to the at least one heat exchanger.

12. The solar thermal power system according to claim 10, wherein the at least one multi-port valve is electrically actuated and is connected to a control unit of the solar power system.

13. The solar thermal power system according to claim 1, wherein the heat sink is a heat reservoir.

14. The solar thermal power system according to claim 2, further comprising: a heat-insulating intermediate layer is arranged between the collector and the at least one heat exchanger, wherein the at least one heat exchanger is plate-shaped with at least one flat surface, the at least one thermogenerator has at least one flat surface, and the thermogenerator and the at least one heat exchanger are arranged with their respective flat surfaces facing a passive rear side of the collector.

15. The solar thermal power system according to claim 7, further comprising an absorber arranged on the hot side of the thermogenerator configured to receive energy of incident solar radiation.

16. The solar thermal power system according to claim 11, wherein the at least one proportional valve is electrically actuated and is connected to a control unit of the solar power system.

17. The solar thermal power system according to claim 1, wherein the thermogenerator, that least one heat exchanger, the thermal insulation, and the collector are arranged in order in a stack.

* * * * *